United States Patent
Niimi

(10) Patent No.: US 7,268,088 B2
(45) Date of Patent: Sep. 11, 2007

(54) FORMATION OF LOW LEAKAGE THERMALLY ASSISTED RADICAL NITRIDED DIELECTRICS

(75) Inventor: Hiroaki Niimi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 11/197,070

(22) Filed: Aug. 4, 2005

(65) Prior Publication Data

US 2007/0029588 A1 Feb. 8, 2007

(51) Int. Cl.
*H01L 21/469* (2006.01)

(52) U.S. Cl. .................. 438/775; 438/764; 438/778

(58) Field of Classification Search ........ 438/775–770, 438/763–769
See application file for complete search history.

(56) References Cited

U.S. PATENT DOCUMENTS

| | | | |
|---|---|---|---|
| 6,503,846 B1 | 1/2003 | Niimi et al. | |
| 6,548,366 B2 | 4/2003 | Niimi et al. | |
| 6,610,614 B2 | 8/2003 | Niimi et al. | |
| 6,632,747 B2 * | 10/2003 | Niimi et al. | 438/775 |
| 6,730,566 B2 | 5/2004 | Niimi et al. | |
| 6,780,719 B2 | 8/2004 | Niimi et al. | |
| 6,911,707 B2 * | 6/2005 | Gardner et al. | 257/410 |
| 2003/0113972 A1 * | 6/2003 | Hayashi et al. | 438/287 |
| 2003/0143813 A1 | 7/2003 | Khamankar et al. | |
| 2004/0235203 A1 | 11/2004 | Gurba et al. | |
| 2004/0262701 A1 | 12/2004 | Alshareef et al. | |

OTHER PUBLICATIONS

"Atomic-Scale Characterization of Nitridation Processes on Si(100)-2×1 Surfaces by Radical Nitrogen", Daisuke Matsushita, Hiroya Ikeda, Akira Sakai, Saigeaki Zaima and Yukio Yasuda, Jpn. J. Appl. Phys, vol. 40 (2001), Part 1, No. 4B, Apr. 2001, pp. 2827-2829.

* cited by examiner

*Primary Examiner*—Dung A. Le
(74) *Attorney, Agent, or Firm*—Peter K. McLarty; W. James Brady, III; Frederick J. Telecky, Jr.

(57) ABSTRACT

One or more aspects of the present invention relate to forming a dielectric suitable for use as a gate dielectric in a transistor. The gate dielectric is formed by a nitridation process that adds nitrogen to a semiconductor substrate.

15 Claims, 4 Drawing Sheets

FORMATION OF LOW LEAKAGE THERMALLY ASSISTED RADICAL NITRIDED DIELECTRICS

FIELD OF INVENTION

The present invention relates generally to semiconductor processing, and more particularly to forming a nitrided dielectric on a semiconductor substrate suitable for use as a transistor gate dielectric.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source while providing increased computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

It will be appreciated that processes for manufacturing integrated circuits comprise hundreds of steps, during which many copies of an integrated circuit can be formed on a single wafer. Generally, such processes involve creating several layers on and in a substrate that ultimately form a complete integrated circuit. This layering process can create electrically active regions in and on the semiconductor wafer surface. In metal-oxide-semiconductor (MOS) transistors, for example, a gate structure is created, which can be energized to establish an electric field within a semiconductor channel, by which current is enabled to flow between a source region and a drain region within the transistor. The source and drain regions facilitate this conductance by virtue of containing a majority of hole (p type) or electron (n type) carriers. The regions are typically formed by adding dopants to targeted areas on either side of the channel region in a semiconductor substrate.

Gate structures in MOS transistors generally include a gate dielectric and a contact or gate electrode. The gate contact generally includes an electrically conductive material, such as metal or doped polysilicon and is formed over the gate dielectric, which is itself formed over the channel region. The gate dielectric is an insulator material, the basic purpose of which is to prevent large 'leakage' currents from flowing from the conductive gate electrode into the conductive channel region when a voltage is applied to the gate contact, while allowing an applied gate voltage to set up an electric field within the channel region in a controllable manner.

It can thus be appreciated that one way to increase packing densities is to decrease the thickness of transistor gate dielectrics to shrink the overall dimensions of transistors, where a very large number of transistors are commonly used in IC's and electronic devices. However, making gate dielectrics thinner can have undesirable results, particularly where $SiO_2$ is used. For example, one shortcoming of a thin $SiO_2$ gate dielectric is increased gate leakage currents due to tunneling of charge carriers through the oxide. Also, a thin $SiO_2$ gate dielectric layer provides a poor diffusion barrier to dopants. This may, for example, allow a subsequently applied dopant (e.g., boron) to penetrate into and contaminate the underlying channel region.

Consequently, recent efforts at device scaling have focused on alternative dielectric materials that are thicker than silicon dioxide (to minimize leakage through the gate dielectric) while exhibiting the same field effect performance. These materials are often referred to as high-k materials because their dielectric constants are greater than that of $SiO_2$ (which is about 3.9). The relative performance of such high-k materials is often expressed as equivalent oxide thickness (EOT) because, while the alternative layer may be thicker, it still provides the equivalent electrical effect of a much thinner layer of $SiO_2$. Accordingly, high-k dielectric materials can be utilized to form gate dielectrics, and the high-k materials facilitate a reduction in device dimensions while maintaining a consistency of desired device performance.

It can thus be appreciated that techniques for uniformly and controllably forming dielectric materials that have desired physical thicknesses while also possessing desired 'electrical thicknesses' or equivalent oxide thicknesses that facilitate device scaling while mitigating adverse effects associated with thin gate dielectrics (e.g., leakage currents) are in demand.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to nitriding a semiconductor substrate to form a dielectric suitable for use as a gate dielectric. The addition of nitrogen effectively increases the dielectric constant of the gate dielectric, thus allowing a physically thicker film to be electrically thinner. In other words, a smaller equivalent oxide thickness (EOT) is achieved. The presence of the nitride also mitigates dopant (e.g., boron) penetration, which could adversely affect device performance.

According to one or more aspects of the present invention, a methodology for forming a dielectric suitable for use as a gate dielectric in a transistor is disclosed. The methodology includes exposing a semiconductor substrate to a plasma nitridation process so that $Si_3N$ is formed on the semiconductor substrate, where the nitridation process is performed in a plasma reactor and an ionic radical nitrogen trap is used to filter out ionic dominant radicals so that predominately neutral radicals impinge upon the semiconductor substrate to form the Si$_3$N bonding configuration dielectric.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
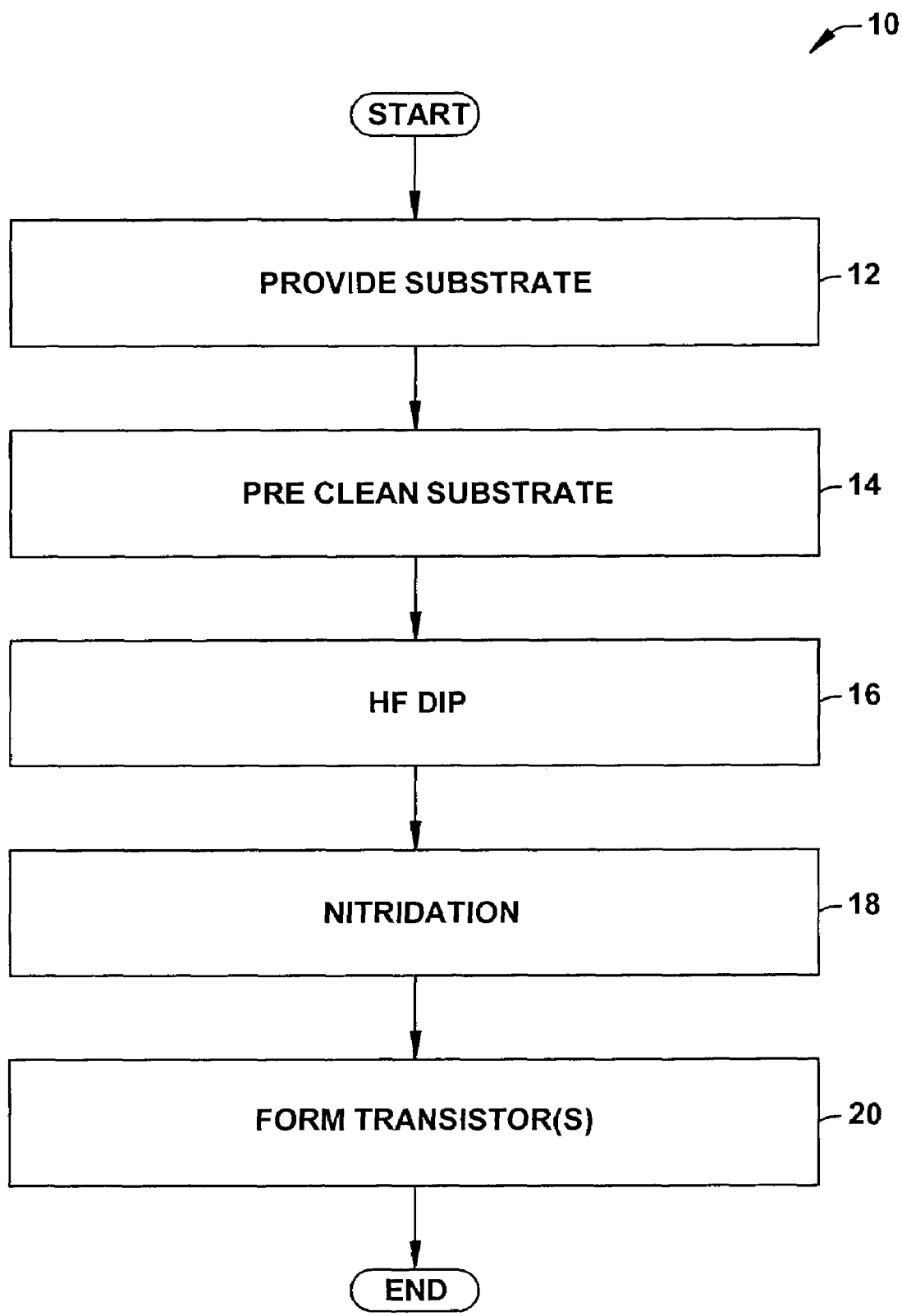
FIG. 1 is a flow diagram illustrating an exemplary methodology for forming a dielectric suitable for use as a transistor gate dielectric according to one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

One or more aspects of the present invention relate to forming a dielectric suitable for use as a gate dielectric by nitriding a semiconductor substrate to form a dielectric. The dielectric is formed in a manner that promotes the formation of Si$_3$N bonding while mitigating the formation of sub nitrides, where Si$_3$N is more desirable than sub nitrides because Si$_3$N bonding configuration is more stable and has fewer dangling or exposed bonds than sub nitrides and therefore provides more reliable performance by mitigating leakage currents, for example.

Turning to FIG. 1, an exemplary methodology 10 is illustrated for forming a dielectric according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
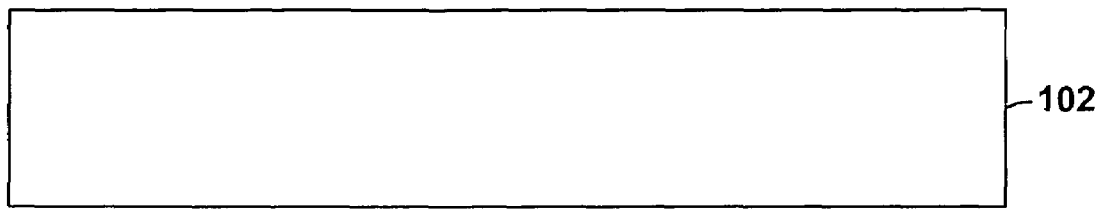
FIGS. 2-5 are cross-sectional illustrations of a dielectric formed in accordance with one or more aspects of the present invention, and the use of that dielectric as a transistor gate dielectric.

The methodology 10 begins at 12, wherein a semiconductor substrate 102 is provided (FIG. 2). It will be appreciated that substrate as referred to herein may comprise any type of semiconductor body (e.g., formed of silicon or SiGe) such as a semiconductor wafer or one or more die on a wafer, as well as any other type of semiconductor and/or epitaxial layers associated therewith. The substrate 102 may optionally be subjected to a pre gate formation clean at 14 followed by a hydrofluoric acid (HF) dip at 16 to remove oxides from the surface of the semiconductor substrate 102.

Figure 3:
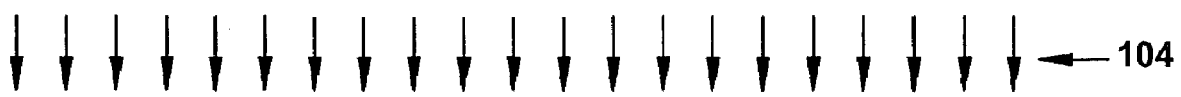
Figure 3:
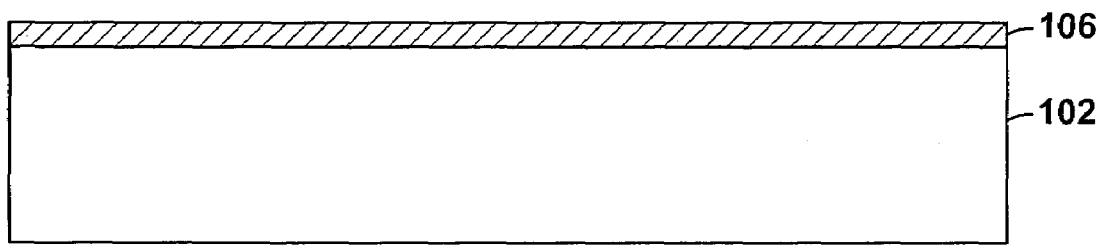

At 18, the substrate 102 is subjected to a nitridation process 104 to form a dielectric 106 on the surface of the substrate 102 (FIG. 3). According to one or more aspects of the present invention, the dielectric 106 comprises predominately Si$_3$N bonding configuration, and is formed to a physical thickness of between about 1.0 nanometers and about 1.6 nanometers, for example, and has an equivalent oxide thickness (EOT) of less than or equal to about 1 nanometer, for example.

According to one or more aspects of the present invention, the nitridation process 104 generally comprises a plasma nitridation process performed in a plasma reactor, wherein an ionic radical nitrogen trap is used to filter out ionic dominant radicals so that predominately neutral radicals impinge upon the surface of the semiconductor substrate 102 to form the Si$_3$N bonding structure dielectric 106. Such a nitrogen trap is basically a mesh like material that essentially filters out non-neutral radicals.

It will be appreciated that process conditions can also be controlled according to one or more aspects of the present invention to further assist with forming the Si$_3$N structure dielectric 106 on the surface of the semiconductor substrate 102. In particular, according to one or more aspects of the present invention, the nitridation process can be performed;

at a temperature of between about 550 degrees Celsius and about 850 degrees Celsius, under a pressure of between about 650 milli Torr and about 900 milli Torr, with an Ar to N$_2$ gas ratio of between about 900 sccm Ar and about 1050 sccm Ar to between about 45 sccm N$_2$ and about 85 sccm N$_2$, at a microwave plasma power of between about 450 watts and about 2050 watts, and for a duration of between about 7 seconds and about 35 seconds.

It will be appreciated that Helium (He), krypton (Kr), and/or xenon (Xe) can be used instead of or in addition to Ar and/or N$_2$. Generally, however, Helium (He), krypton (Kr), and/or xenon (Xe) are utilized as dilution gases.

Figure 4:
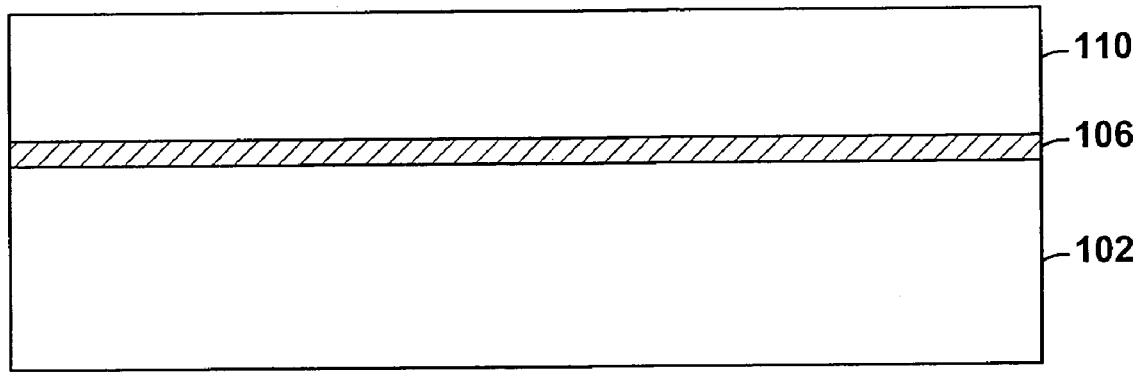
Figure 5:
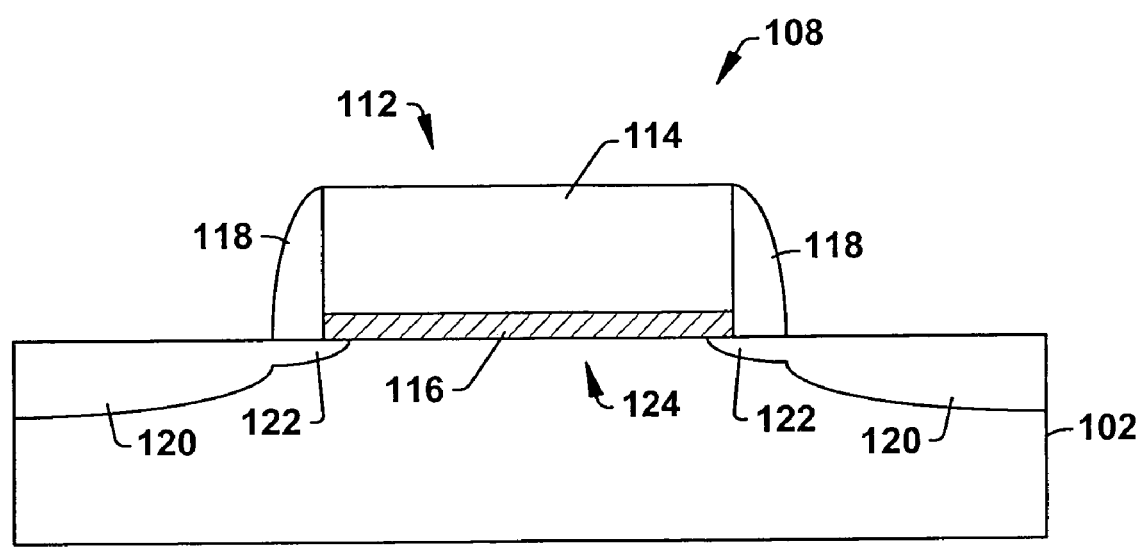

Once the dielectric 106 is formed, then one or more transistors 108 can be formed at 20 with the dielectric 106 serving as a gate dielectric for the transistor. More particularly, a layer of conductive material 110 (e.g., a few nanometer thick layer of polysilicon) can be formed over the dielectric 106 (FIG. 4). The conductive layer 110 and the dielectric 106 can then be patterned to form a gate structure or stack 112, which comprises a gate electrode 114 and a gate dielectric 116 (FIG. 5). The gate electrode 114 serves as an electrically conductive contact that allows a bias (voltage) to be applied to the transistor 108 to develop an electric field therein.

It will be appreciated that the patterning can be performed with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched). Here, a patterned resist can serve as a mask for patterning the conductive layer 110 and/or the dielectric 106.

One or more sidewall spacers 118 can be formed adjacent to the gate structure 112 and source/drain, LDD and/or MDD implants can be performed (depending upon the type(s) of transistors to be formed) to establish source and drain regions 120 and/or source and drain extension regions 122 within the substrate 102 adjacent to the gate structure 112, and also to establish a channel region 124 within the substrate 102 underneath the gate structure 112. Further metallization, and/or other back-end processing (now shown) can also be subsequently performed. It will be appreciated that forming a dielectric for use in a transistor as described herein can be implemented in a CMOS fabrication process in an efficient and cost effective manner.

Figure 6:
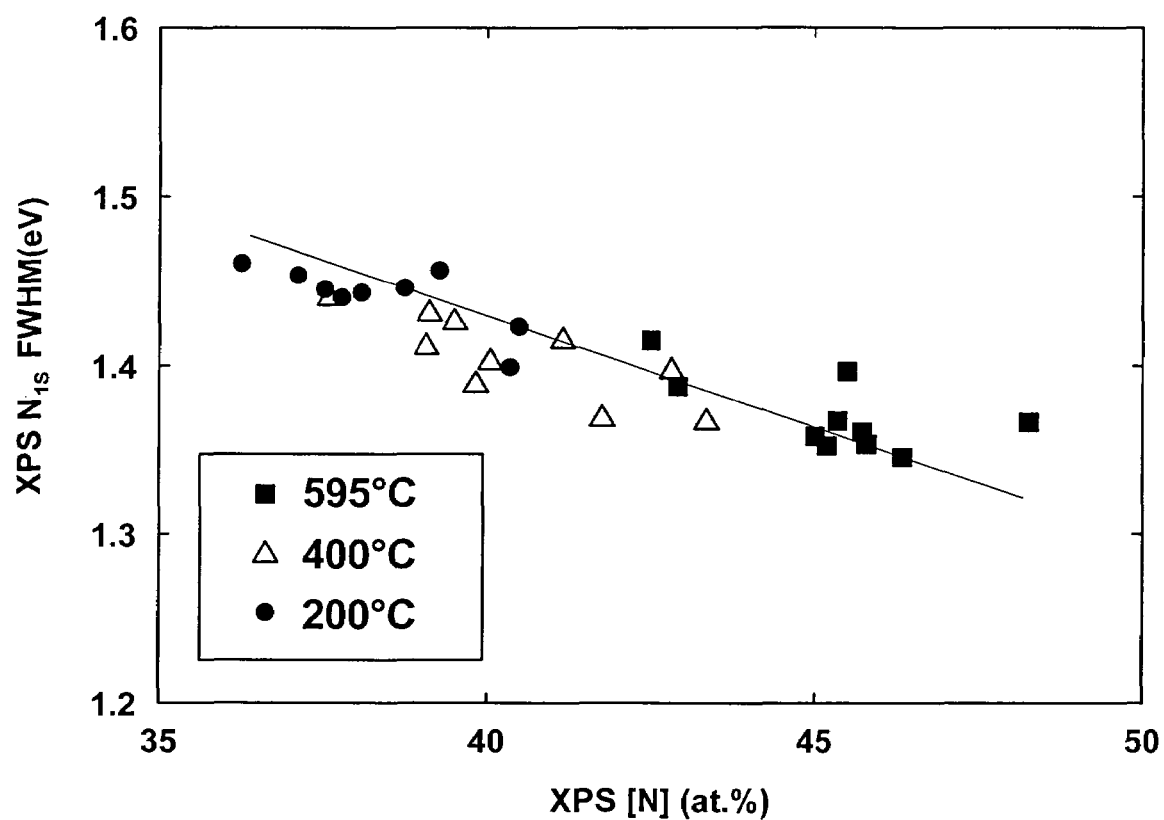
FIG. 6 is an exemplary XPS data table illustrating the effects of temperature on dielectric formation.

Turning to FIG. 6, an exemplary XPS (X-ray Photoelectron Spectroscopy) Data Table is illustrated, which has the XPS for nitrogen at different percentages plotted on the x axis and the full width at half maximum (FWHM) of XPS $N_{1s}$ spectrum in electron volts (eV) plotted on the y axis. In the illustrated example, three different data sets are presented, namely for 200 degrees Celsius, 400 degreed Celsius and 595 degrees Celsius. It can be appreciated that the first data set of 200 degrees Celsius corresponds to higher FWHM values, the second data set of 400 degrees Celsius corresponds to lower FWHM values and third data set of 595 degrees Celsius corresponds to even lower FWHM values, generally indicating that the FWHM goes down as temperature increases. It will be appreciated that lower values for the metric FWHM, as are arrived at by utilizing high temperatures as described herein, corresponds to fewer sub nitrides in a dielectric. As such, forming a dielectric as described herein at higher temperatures is desirable because it produces a more stable dielectric.

Accordingly, it will be appreciated that forming a dielectric as described herein mitigates the formation of sub nitrides (e.g., $Si_2N$, SiN bonding configurations) on the surface of the semiconductor substrate 102, where sub nitrides are undesirable because they can leave dangling bonds, which can adversely affect transistor performance (e.g., leading to the development of leakage currents, etc.). Stated another way, $Si_3N$ is desirable because one nitrogen atom bonded to three silicon atoms is very stable or has a strong bonding configuration and results in little to no undesirable dangling bonds.

Additionally, performing the nitridation process 104 as described herein (e.g., in the absence of first performing an oxidation action and/or forming of an oxide layer) streamlines the fabrication process while allowing a sub 1 nanometer EOT to be achieved. A conventional plasma nitrided oxide (PNO) does not allow a sufficient concentration of nitride atoms to be incorporated into the dielectric to adequately mitigate leakage currents. Also, heating the substrate as described herein helps to mitigate the formation of sub nitrides. Plasma processing is generally performed at low temperatures (e.g., at around room temperature or less than 400 degrees Celsius) and such heating is thus not necessary or performed in conventional plasma processing. Performing the nitridation process with predominately neutral radicals (e.g., by filtering out ionic radicals) also helps to mitigate the formation of sub nitrides and/or leads to stoichiometric nitride formation. Further, performing the plasma nitridation process 104 as described herein, as opposed to performing an $NH_3$ anneal, for example, to instill nitride atoms in the dielectric does not result in hydrogen atoms being formed in the dielectric, where hydrogen atoms are undesirable in the dielectric as they can promote defect centers therein which can lead to erratic device performance as well as to other undesirable results.

It will be appreciated that while reference is made throughout this document to exemplary structures in discussing aspects of a methodology described herein (e.g., those structures presented in FIGS. 2-5 while discussing the methodology set forth in FIG. 1), that the methodology is not to be limited by the corresponding structures presented. Rather, the methodology and structures are to be considered independent of one another and able to be individually practiced.

It is also to be appreciated that layers and/or elements depicted herein are illustrated with particular dimensions relative to one another (e.g., layer to layer dimensions and/or orientations) for purposes of simplicity and ease of understanding, and that actual dimensions of these elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a dielectric suitable for use as a gate dielectric in a transistor, comprising:
   exposing a semiconductor substrate to a plasma nitridation process so that $Si_3N$ bonding configuration is formed on the semiconductor substrate, where the nitridation process is performed in a plasma reactor and an ionic radical nitrogen trap is used to filter out ionic dominant radicals so that predominately neutral radicals impinge upon the semiconductor substrate to form the stoichiometric $Si_3N$ bonding configuration dielectric.

2. The method of claim 1, wherein at least one of;
the dielectric is formed to a physical thickness of between about 1.0 nanometers and about 1.6 nanometers, and
the dielectric has an equivalent oxide thickness (EOT) of less than or equal to about 1 nanometer.

3. The method of claim 1, wherein the plasma nitridation process is performed at a temperature of between about 550 degrees Celsius and about 850 degrees Celsius.

4. The method of claim 1, wherein the plasma nitridation process is performed under a pressure of between about 650 milli Torr and about 900 milli Torr.

5. The method of claim 1, wherein the plasma nitridation process is performed with $N_2$ and at least one of Ar, He, Kr and Xe.

6. The method of claim 5, wherein the plasma nitridation process is performed with an Ar to $N_2$ gas ratio of between about 900 sccm Ar and about 1050 sccm Ar to between about 45 sccm $N_2$ and about 85 sccm $N_2$.

7. The method of claim 1, wherein the plasma nitridation process is performed at a microwave power of between about 450 watts and about 2050 watts.

8. The method of claim 1, wherein the plasma nitridation process is performed for a duration of between about 7 seconds and about 35 seconds.

9. The method of claim 2, wherein at least one of;
the plasma nitridation process is performed at a temperature of between about 550 degrees Celsius and about 850 degrees Celsius,
the plasma nitridation process is performed under a pressure of between about 650 milli Torr and about 900 milli Torr,
the plasma nitridation process is performed with an Ar to $N_2$ gas ratio of between about 900 sccm Ar and about 1050 sccm Ar to between about 45 sccm $N_2$ and about 85 sccm $N_2$,
the plasma nitridation process is performed at a microwave plasma power of between about 450 watts and about 2050 watts, and
the plasma nitridation process is performed for a duration of between about 7 seconds and about 35 seconds.

10. A method of forming a dielectric suitable for use as a gate dielectric in a transistor, comprising:
exposing a semiconductor substrate to a plasma nitridation process so that $Si_3N$ bonding configuration is formed on the semiconductor substrate, where the nitridation process is performed in a plasma reactor and an ionic radical nitrogen trap is used to filter out ionic dominant radicals so that predominately neutral radicals impinge upon the semiconductor substrate to form the $Si_3N$ bonding structure dielectric, and where at least one of;
the plasma nitridation process is performed at a temperature of between about 550 degrees Celsius and about 850 degrees Celsius,
the plasma nitridation process is performed under a pressure of between about 650 milli Torr and about 900 milli Torr,
the plasma nitridation process is performed with an Ar to $N_2$ gas ratio of between about 900 sccm Ar and about 1050 sccm Ar to between about 45 sccm $N_2$ and about 85 sccm $N_2$,
the plasma nitridation process is performed at a microwave plasma power of between about 450 watts and about 2050 watts, and
the plasma nitridation process is performed for a duration of between about 7 seconds and about 35 seconds.

11. The method of claim 10, wherein at least one of;
the dielectric is formed to a physical thickness of between about 1.0 nanometers and about 1.6 nanometers, and
the dielectric has an equivalent oxide thickness (EOT) of less than or equal to about 1 nanometer.

12. The method of claim 10, where the dielectric is implemented in a transistor, the method further comprising:
forming a layer of conductive material over the dielectric;
patterning the layer of conductive material and the dielectric to form a gate stack that comprises a gate dielectric and a gate electrode; and
forming source and drain regions within the substrate adjacent to the gate stack, thereby establishing a channel region within the substrate below the gate stack.

13. The method of claim 12, further comprising:
forming sidewall spacers adjacent to the gate stack; and
forming source/drain extension regions within the substrate.

14. The method of claim 11, where the dielectric is implemented in a transistor, the method further comprising:
forming a layer of conductive material over the dielectric;
patterning the layer of conductive material and the dielectric to form a gate stack that comprises a gate dielectric and a gate electrode; and
forming source and drain regions within the substrate adjacent to the gate stack, thereby establishing a channel region within the substrate below the gate stack.

15. The method of claim 12, further comprising:
forming sidewall spacers adjacent to the gate stack; and
forming source/drain extension regions within the substrate.

* * * * *